United States Patent
Morisawa et al.

(10) Patent No.: US 7,987,012 B2
(45) Date of Patent: Jul. 26, 2011

(54) CONTROL DEVICE OF SUBSTRATE PROCESSING APPARATUS AND CONTROL PROGRAM THEREFOR

(75) Inventors: Daisuke Morisawa, Nirasaki (JP); Masayuki Hirose, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 385 days.

(21) Appl. No.: 12/187,956

(22) Filed: Aug. 7, 2008

(65) Prior Publication Data

US 2008/0306615 A1    Dec. 11, 2008

Related U.S. Application Data

(63) Continuation-in-part of application No. PCT/JP07/52021, filed on Feb. 6, 2007.

(30) Foreign Application Priority Data

Feb. 7, 2006    (JP) ................................. 2006-029327

(51) Int. Cl.
*G06F 19/00* (2006.01)
*G06F 7/00* (2006.01)
*H01L 21/66* (2006.01)
*H01L 21/00* (2006.01)

(52) U.S. Cl. .......... 700/95; 700/108; 700/121; 700/169; 702/102; 438/28; 438/758; 707/609; 707/634

(58) Field of Classification Search .................. 700/108, 700/121, 169, 95; 702/102; 438/28, 758; 707/609, 634

See application file for complete search history.

(56) References Cited

U.S. PATENT DOCUMENTS

| 4,444,036 A | * | 4/1984 | Shibata et al. ................. 72/138 |
| 4,701,007 A | * | 10/1987 | Jonca ............................ 385/147 |
| 5,559,709 A | * | 9/1996 | Ohno et al. ..................... 700/95 |
| 5,740,065 A | * | 4/1998 | Jang et al. ..................... 700/108 |

(Continued)

FOREIGN PATENT DOCUMENTS

JP    9-129529 A    5/1997

(Continued)

OTHER PUBLICATIONS

Ridents et al., "Waferless Pattern Recognistion Recipe Creation Using StatTrax",1996, IEEE, p. 353-358.*

*Primary Examiner* — Albert Decady
*Assistant Examiner* — Thomas Stevens
(74) *Attorney, Agent, or Firm* — Oblon, Spivak, McClelland, Maier & Neustadt, L.L.P.

(57) ABSTRACT

A control device is provided that flexibly controls a substrate processing apparatus for each product process. Four process recipes PM 1 to PM 4 are stored in a first storage unit 255a. Corresponding to each of the process recipes, a high temperature, a medium temperature, and a low temperature pre-recipe are stored in a second storage unit 255b. A process recipe determination unit 260 determines, in response to a recipe specified by the operator, a process recipe corresponding to the specified recipe from the first storage unit 255a. A stage temperature acquisition unit 265 acquires, from the determined process recipe, a stage temperature. A pre-recipe selection unit 270 selects, from the three types of pre-recipes stored in the second storage unit 255b, one pre-recipe corresponding to the stage temperature. Before the wafer W is deposition-processed, therefore, the PM may be well-conditioned according to the selected pre-recipe.

8 Claims, 12 Drawing Sheets

U.S. PATENT DOCUMENTS

| | | | |
|---|---|---|---|
| 5,777,876 A * | 7/1998 | Beauchesne | 700/95 |
| 5,925,212 A * | 7/1999 | Rice et al. | 156/345.27 |
| 5,943,230 A | 8/1999 | Rinnen et al. | |
| 6,801,826 B2 * | 10/2004 | Tanabe | 700/121 |
| 6,807,452 B2 * | 10/2004 | Mukuta et al. | 700/99 |
| 6,879,871 B2 * | 4/2005 | Grasshoff et al. | 700/121 |
| 6,889,105 B2 * | 5/2005 | Mukuta et al. | 700/100 |
| 6,937,963 B2 * | 8/2005 | Ishii et al. | 702/185 |
| 7,020,535 B1 * | 3/2006 | Bode et al. | 700/108 |
| 7,257,453 B2 * | 8/2007 | Kemmoku | 700/100 |
| 7,751,921 B2 * | 7/2010 | Sakamoto et al. | 700/108 |
| 7,778,533 B2 * | 8/2010 | Aderhold et al. | 392/418 |
| 2002/0013637 A1 * | 1/2002 | Redinbo et al. | 700/121 |
| 2002/0173868 A1 * | 11/2002 | Mukuta et al. | 700/100 |
| 2003/0163212 A1 * | 8/2003 | Smith et al. | 700/95 |
| 2004/0185583 A1 * | 9/2004 | Tomoyasu et al. | 438/8 |
| 2005/0228523 A1 * | 10/2005 | Heminway et al. | 700/100 |
| 2005/0246051 A1 * | 11/2005 | Kim | 700/121 |
| 2006/0015206 A1 * | 1/2006 | Funk et al. | 700/121 |
| 2006/0161284 A1 * | 7/2006 | Ikeno et al. | 700/99 |
| 2006/0195218 A1 * | 8/2006 | Yamashita et al. | 700/121 |
| 2008/0208385 A1 * | 8/2008 | Sakamoto et al. | 700/121 |
| 2009/0018692 A1 * | 1/2009 | Yoneda | 700/121 |

FOREIGN PATENT DOCUMENTS

| | | |
|---|---|---|
| JP | 10-326731 A | 12/1998 |
| JP | 2000-31242 A | 1/2000 |
| JP | 2005-259931 A | 9/2005 |

* cited by examiner

FIG.6

| PROCESS RECIPE PM1 | | | |
|---|---|---|---|
| MODULE TYPE | Ti | | |
| STAGE HEATER SET TEMPERATURE | 640°C (FIXED) | | |

| STEP ITEM | STEP 1 | STEP 2 | STEP 3 |
|---|---|---|---|
| TIME (s) | 10 | 5 | 5 |
| PRESSURE (Torr) | 2 | 5 | 0 |
| $TiCl_4$ FLOW RATE (sccm) | 0 | 20 | 0 |
| $ClF_3$ FLOW RATE (sccm) | 0 | 0 | 0 |
| Ar FLOW RATE (sccm) | 0 | 0 | 1000 |
| $H_2$ FLOW RATE (sccm) | 20 | 20 | 0 |
| $NH_3$ FLOW RATE (sccm) | 0 | 0 | 0 |
| $N_2$ FLOW RATE (sccm) | 0 | 0 | 0 |
| $TiCl_4$ FLOW MODE | Auto Flow | Auto Flow | Auto Flow |
| $ClF_3$ FLOW MODE | Auto Flow | Auto Flow | Auto Flow |
| Ar FLOW MODE | Auto Flow | Auto Flow | Auto Flow |
| RF OUTPUT (W) | | | |

CONTROL DEVICE OF SUBSTRATE PROCESSING APPARATUS AND CONTROL PROGRAM THEREFOR

BACKGROUND OF THE INVENTION

1. Field of the Invention

The present invention relates to a control device that controls a substrate processing apparatus according to a recipe and a control program therefor.

2. Description of the Related Art

A substrate processing system has been known to subject a substrate to desired processes such as deposition and etching. The processes are performed by the substrate processing system that is controlled by a control device according to a recipe (hereafter referred to as a process recipe) for processing the substrate (see, for example, JP Publication No. H9-129529). The process recipe used for the substrate processing includes time series data of process conditions for processing the substrate (such as temperature, gas flow rate, and RF output). One product process may require one process recipe.

Conventional hardware performance allows only a single process to be performed by one substrate processing system. Only a single process recipe has thus been available for one substrate processing system. The inside of the substrate processing apparatus is usually optimally conditioned before the substrate processing according to another recipe (hereafter referred to as a pre-recipe). Similar to the process recipe, only a single pre-recipe has been available for one substrate processing apparatus.

Recent advancement of the hardware performance, however, allows several types of processes to be performed by one substrate processing apparatus. The deposition system may combine, for example, the conventional chemical vapor deposition (CVD) process and the atomic layer deposition (ALD) process. The ALD switches the supplies of the several types of source gases as appropriate to control reactions of the gases before their reaching the substrate. The ALD may thus alternately supply each type of source gas to the substrate, thereby forming a set of very thin layers on the substrate at a lower process temperature than the conventional deposition processes. Specifically, the process recipe includes a set temperature as high as approximately 650 C for the conventional deposition processes and as low as approximately 450 C for the ALD deposition process.

Previous experiments on various processes show that when the process recipe has a set temperature largely different for different process types, it may be required that the data in the pre-recipe such as the gas flow rate and the RF output be set again, for each process type, to an optimum value not corresponding to the change in the set temperature of the process recipe. The data in the pre-recipe may thus be optimized for each process. The inside of the substrate processing apparatus may therefore be optimally conditioned for each process before the substrate processing, thereby subjecting the substrate to the optimum processing.

However, different types of processes performed by the substrate processing apparatus may require the operator to manually register the data of the pre-recipe to an optimum value for each type of process. The registration will take a long time and be very inefficient. Further, a typing error during the registration may cause the substrate processing apparatus to be controlled according to the recipe including the error. No optimum process result may thus be provided, or no good plasma processing may be applied to the substrate. It may be preferable to construct a control device that automatically controls the substrate processing apparatus in a way that the control device may flexibly correspond to a hardware advance in the future. The control device may thus effectively increase the commercial value of the expensive substrate processing system.

It is therefore an object of the present invention to provide a control device that flexibly controls a substrate processing apparatus for various processes and a control program therefor.

SUMMARY OF THE INVENTION

To address the issues, therefore, an embodiment of the present invention provides a control device of a substrate processing apparatus that controls the substrate processing apparatus according to a pre-recipe including data of a control procedure of the substrate processing apparatus, and processes a substrate to be processed which transferred to the substrate processing apparatus according to a process recipe including data of a processing procedure of the substrate to be processed.

The control device includes a first storage unit storing one or more process recipes; a second storage unit that stores a plurality of types of pre-recipes corresponding to the process recipes so that the control procedure of the substrate processing apparatus may be changed corresponding to specific data in each process recipe; an determination unit that determines, in response to a recipe specified for one or more substrates to be processed, a process recipe corresponding to the specified recipe from a plurality of process recipes stored in the first storage unit; an acquisition unit that acquires the specific data from data in the determined process recipe; and a selection unit that selects one pre-recipe corresponding to the acquired specific data from the plurality of the types of pre-recipes stored in the second storage unit corresponding to the determined process recipe.

From among the types of pre-recipes stored in the second storage unit, one pre-recipe corresponding to the specific data of a process recipe is selected. Thus, different types of processes performed by the substrate processing apparatus may not require the operator to manually re-register the data of the pre-recipe to an optimum value for each type of process. This is efficient and may control a typing error during the registration. According to the optimized pre-recipe, the inside of the substrate processing apparatus may be optimally conditioned for each process. In the well-conditioned inside of the substrate processing apparatus, the substrate may be processed optimally according to the process recipe.

The acquisition unit may acquire, as the specific data, temperature data included in the determined process recipe, the temperature data being data on temperature. The temperature data acquired from the process recipe includes, by way of example, a stage heater set temperature and a shower heater temperature. The stage heater set temperature may be a set temperature at the outer edge of the stage heater or a set temperature at the center of the stage heater. The specific data is not limited to data on temperature, and may be, for example, pressure data, gas flow rate data, and plasma application power data.

The second storage unit may store the plurality of types of pre-recipes corresponding to the process recipes, the pre-recipes showing different control procedures for different temperatures used to control the substrate processing apparatus, and the selection unit may compare the acquired temperature data and a given threshold, and selects, according to the comparison result, a pre-recipe corresponding to the acquired temperature data from the plurality of the types of pre-recipes stored in the second storage unit.

More specifically, the second storage unit may store, corresponding to the temperature used to control the substrate processing apparatus, a high-temperature pre-recipe, a medium-temperature pre-recipe, and a low-temperature pre-recipe, the pre-recipes corresponding to the process recipes, the selection unit may compare the acquired temperature data and a first threshold for distinguishing between a high temperature and a medium temperature, when the comparison result shows that the temperature data is equal to or more than the first threshold, the selection unit may select the high-temperature pre-recipe stored in the second storage unit, when the comparison result shows that the temperature data is less than the first threshold, the selection unit may further compare the temperature data and a second threshold for distinguishing between a medium temperature and a low temperature, when the comparison result shows that the temperature data is equal to or more than the second threshold, the selection unit may select the medium-temperature pre-recipe stored in the second storage unit, and when the comparison result shows that the temperature data is less than the second threshold, the selection unit may select the low-temperature pre-recipe stored in the second storage unit.

Previous experiments on various processes show that when the process recipe has a set temperature largely different for different types of processes, such as 450 C, 550 C, or 650 C, it may be required that the data in the pre-recipe such as the gas flow rate and the RF output be set again, for each process type, to an optimum value not corresponding to the change in the set temperature of the process recipe. In contrast, the present invention selects, from a high-temperature pre-recipe, a medium-temperature pre-recipe, and a low-temperature pre-recipe stored in the second storage unit, one pre-recipe corresponding to the temperature data in the process recipe. The pre-recipe thus selected has the optimized data for each process. The selected pre-recipe may thus provide the optimum process result. The substrate processing apparatus may thus be flexibly controlled corresponding to the various product processes without a one-to-one link between the process recipes and the pre-recipes for each product process.

The one or more substrates to be processed may be determined by specifying at least one of identification information on a lot including a plurality of substrates and identification information on a substrate.

The determination unit may determine, in response to specification of identification information on a first lot, specification of a first recipe to be used for the first lot, specification of identification information on a second lot, and specification of a second recipe to be used for the second lot, from the process recipes stored in the first storage unit, a first and a second process recipe corresponding to the specified first and second recipes, respectively, the acquisition unit may acquire, from data in the determined first and second process recipes, first and second temperature data on the temperature, and the selection unit may select respectively, when the first and second temperature data differ, each pre-recipe corresponding to the first process recipe and another pre-recipe corresponding to the second process recipe from the types of pre-recipes stored in the second storage unit to control the substrate processing apparatus using the pre-recipes before the first and second lots are processed.

Therefore, even when lots of different process temperatures (temperature data) are successively performed, the inside of the substrate processing apparatus may be optimally conditioned for each process before the substrate processings (i.e., before the substrate processings of the first and second lots that are to be successively performed), according to the pre-recipes selected respectively corresponding to the first and second process recipes. Each of the lots to be successively performed may have its substrates processed optimally.

The control device of the substrate processing apparatus may further include a correction unit that determines a degree of difference between the data on temperature in the pre-recipe selected by the selection unit and the temperature data acquired by the acquisition unit, and corrects, depending on the determined degree of difference, predetermined data in the selected pre-recipe.

A predetermined rule may thus be used to correct predetermined data in the pre-recipe. A large difference (approximately 100 C) between the temperature data for each product process may be addressed by selecting the optimum pre-recipe for the product process (for example, temperature data of the process recipe) from a plurality of types of pre-recipes. A slight difference (approximately a few C to a few ten C) between the temperature data in the process recipe and the temperature data in the selected pre-recipe may be addressed by correcting the selected pre-recipe. In this way, the pre-recipe data may be optimized at two stages of selection and correction, thus conditioning the inside of the substrate processing apparatus more flexibly for each product process. Thus, in the inside of the substrate processing apparatus that is extremely well-conditioned, a uniform and good process may be provided to the substrate. Note that the degree of difference between the temperature data in the process recipe and the temperature data in the selected pre-recipe may be determined by the difference between the two sets of temperature data or by a ratio of the temperature data in the process recipe and the temperature data in the pre-recipe.

To address the issues, another embodiment of the present invention provides a control program of a substrate processing apparatus, the program allowing a computer to control the substrate processing apparatus according to a pre-recipe including data of a control procedure of the substrate processing apparatus, and to process a substrate to be processed which transferred to the substrate processing apparatus according to a process recipe including data of a processing procedure of the substrate to be processed, the program comprising: storing one or more process recipes in a first storage unit; storing a plurality of types of pre-recipes corresponding to the process recipes in a second storage unit so that the control procedure of the substrate processing apparatus may be changed corresponding to specific data in each process recipe; determining, in response to a recipe specified for one or more substrates to be processed, a process recipe corresponding to the specified recipe from a plurality of process recipes stored in the first storage unit; acquiring the specific data from data in the determined process recipe; and selecting, from the plurality of the types of pre-recipes stored in the second storage unit, one pre-recipe corresponding to the determined process recipe, particularly to the acquired specific data.

Therefore, from among a plurality of types of pre-recipes stored in the second storage unit, one pre-recipe corresponding to specific data in the process recipe may be selected. Thus, different types of processes performed by the substrate processing apparatus may not require the operator to manually re-register the data of the pre-recipe for each type of process. This is efficient and may control the typing error during the registration. According to the pre-recipe having the optimum value, the inside of the substrate processing apparatus may be optimally conditioned for each process. The substrate may thus be processed optimally according to the process recipe in a very good environment.

In this way, hardware including the substrate processing apparatus may be automatically controlled using software (i.e., hardware and software may be cooperated), thus automatically flexibly corresponding to a further hardware advance in the future. The expensive substrate processing apparatus may thus be more commercially valuable.

Thus, the present invention may flexibly control the substrate processing apparatus for various processes.

BRIEF DESCRIPTION OF THE DRAWINGS

FIG. 6 illustrates a portion of data included in a process recipe;

DESCRIPTION OF THE PREFERRED EMBODIMENTS

With reference to the accompanying drawings, preferred embodiments of the present invention are described in more detail below. Note that, in the following discussion and accompanying drawings, the elements having the same configurations and functions are provided with the same reference symbols and their description will be omitted.

Note also that in the present specification, one Torr is (101325/760) Pa and one sccm is $(10^{-6}/60)$ m$^3$/sec.

First Embodiment

Figure 1:
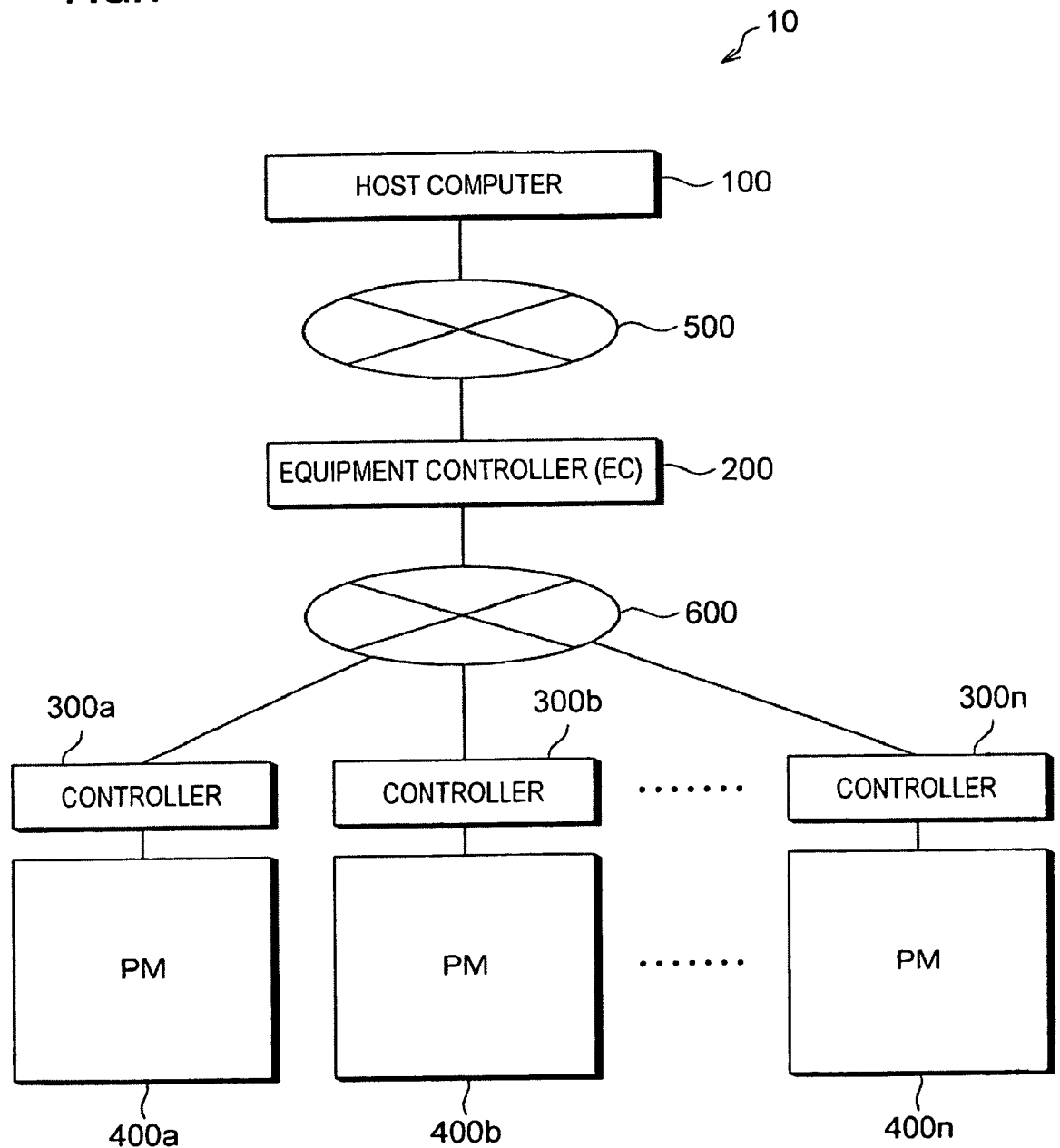
FIG. 1 shows a substrate processing system according to each embodiment of the present invention.

With reference to FIG. 1, a substrate processing system using a control device according to a first embodiment of the present invention is described below. Note that this embodiment is described with respect to a process where a substrate is covered with a Ti layer (or TiN layer).

(Substrate Processing System)

A substrate processing system 10 includes a host computer 100, a master controller (hereafter referred to as an equipment controller (EC)) 200, n controllers (controllers 300a to 300n), and n process modules (PMs)(PMs 400a to 400n). The host computer 100 and the EC 200 are connected via a network 500 such as the Internet. The EC 200 and the controllers are connected via a network 600 such as Local Area Network (LAN).

The host computer 100 manages the whole substrate processing system 10. The computer 100 may manage, for example, data of the whole system 10. The EC 200 stores recipes (a process recipe and a pre-recipe) to control the deposition process. According to the recipes, the EC 200 transmits instructions to control the deposition process to the controllers 300a to 300n. The EC 200 also manages the recipes such as storing the historical record of the used recipes.

The controllers 300a to 300n control, according to the instructions from the EC 200, the PMs 400a to 400n, respectively. The PMs 400a to 400n carry out, according to the control, the deposition processes on the transferred wafer W. Process data (such as a change over time of temperature, pressure, and gas flow rate) is transmitted from the controllers 300a to 300n via the EC 200 to the host computer 100.

Figure 2:
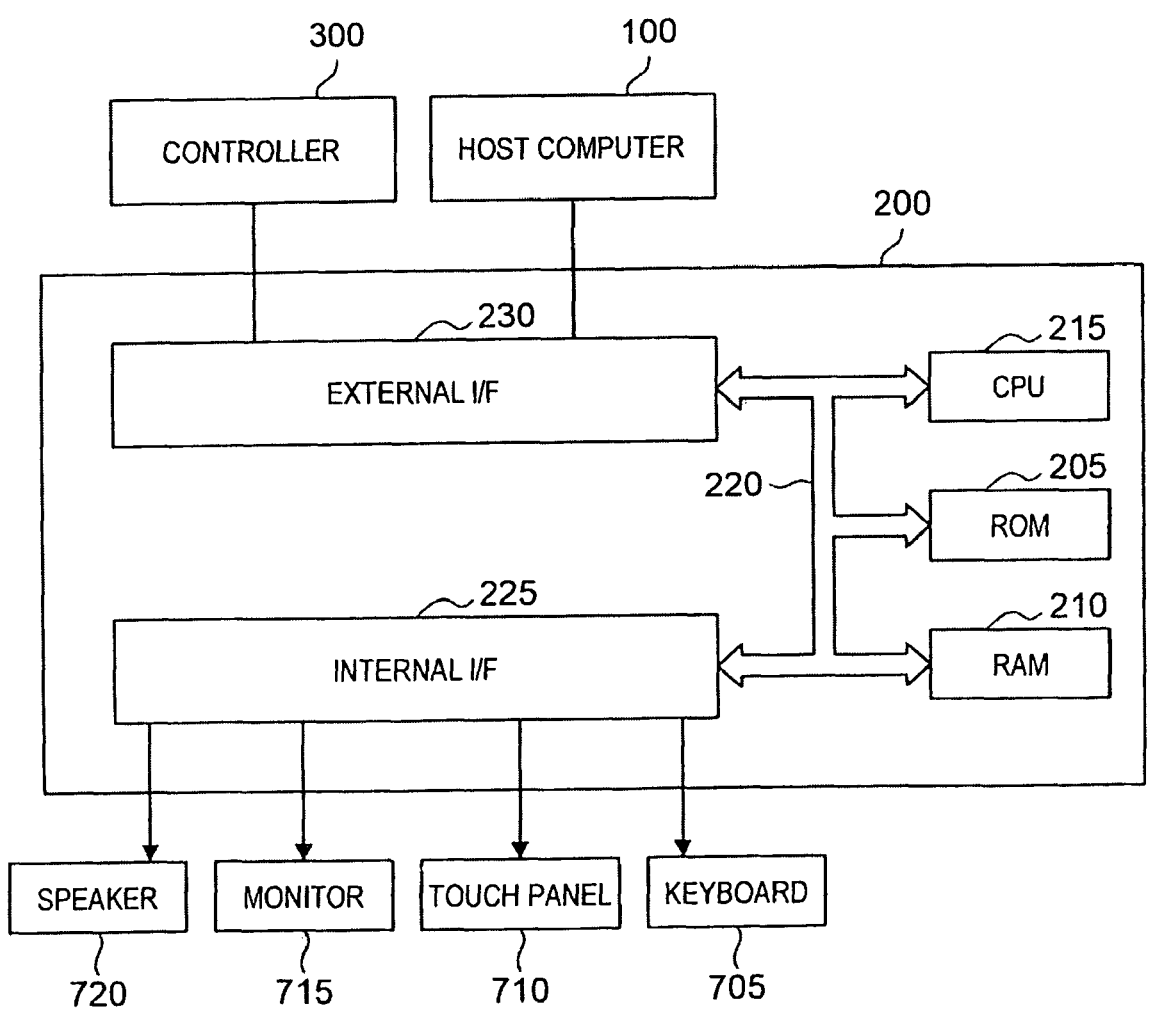
FIG. 2 is a hardware configuration diagram of EC according to each embodiment.
Figure 3:
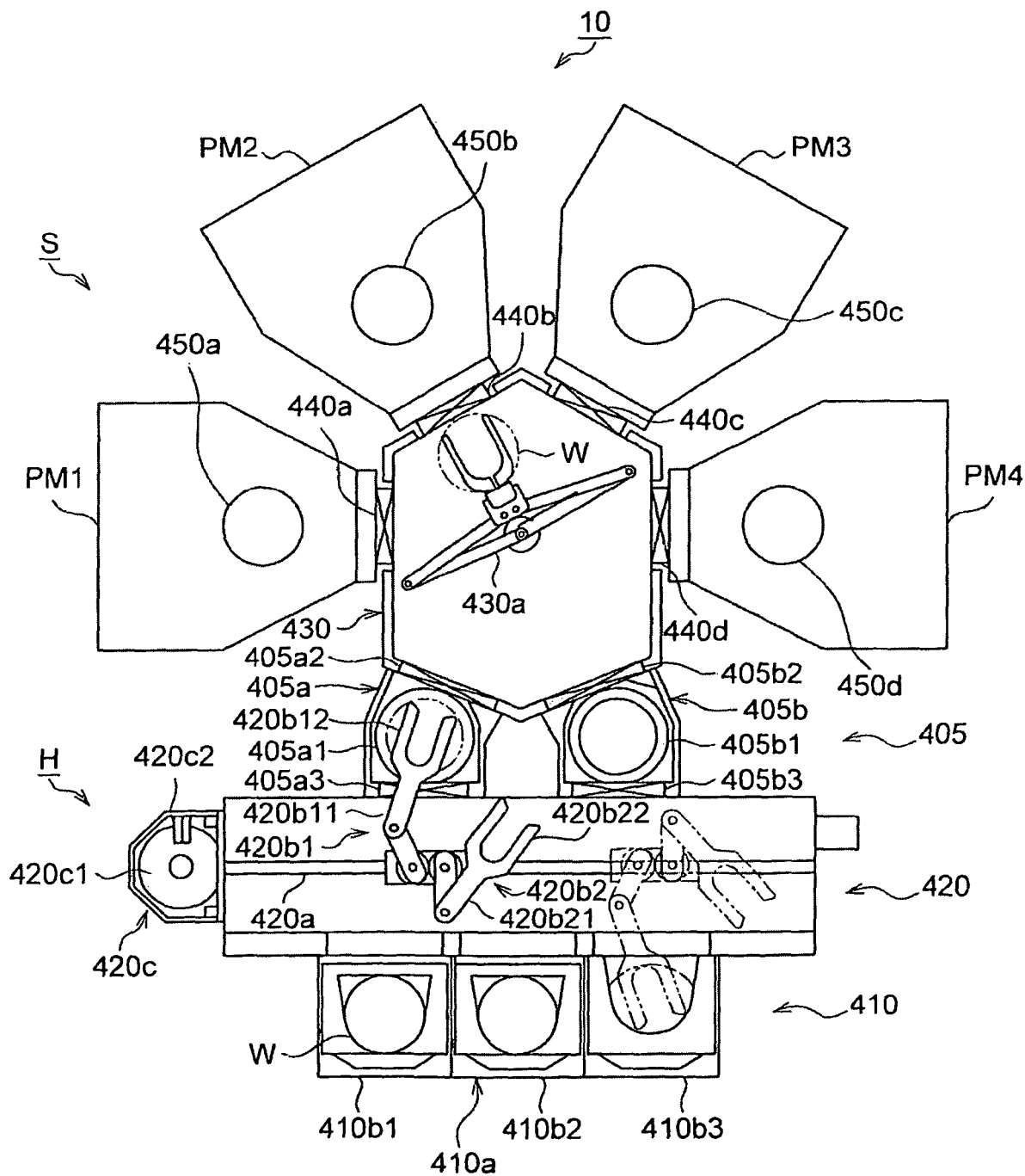
FIG. 3 is a hardware configuration diagram of a substrate processing system according to each embodiment.

Referring to FIGS. 2 and 3, the hardware configurations of the EC 200 and the PM 400 are described below. Note that although the hardware configurations of the host computer 100 and the controllers 300 are not shown, they are similar to that of the EC 200.

(Hardware Configuration of EC)

Referring to FIG. 2, the EC 200 includes a ROM 205, a RAM 210, a CPU 215, a bus 220, an internal interface (internal I/F) 225, and an external interface (external I/F) 230.

The ROM 205 stores a basic program performed by the EC 200, a program starting under abnormal conditions, the process recipe, the pre-recipe, and the like. The RAM 210 accumulates various programs and data. The ROM 205 and the RAM 210 are examples of the storage device. They may be other storage devices such as an EEPROM, an optical disk, and a magneto-optical disk.

The CPU 215 controls, according to the process recipe and the pre-recipe, the deposition process. The bus 220 is a path through which the ROM 205, the RAM 210, the CPU 215, the internal interface 225, and the external interface 230 exchange information between them.

The internal interface 225 receives, through the operator's operation via a keyboard 705 or a touch panel 710, data on the deposition process. The internal interface 225 then outputs necessary data to a monitor 715 or a speaker 720. The external interface 230 transmits and receives data from the host computer 100 connected to the network 500. The external interface 230 also transmits and receives data from each of the controllers 300 connected to the network 600.

(Hardware Configuration of PM)

Referring to FIG. 3, the substrate processing system 10 includes a transfer system H and a processing system S. The transfer system H transfers the wafer W. The processing system S carries out the deposition process on the wafer W. The transfer system H and the processing system S are coupled via a load lock chamber 405 (load lock chambers 405a and 405b).

The transfer system H includes a cassette stage 410 and a transfer stage 420. The cassette stage 410 includes a cassette table 410a. The cassette table 410a supports three cassettes 410b1 to 410b3 thereon. Each of the cassettes 410b may contain, for example, a maximum of 25 wafers W in individual slots.

The transfer stage 420 includes at its center a guide rail 420a along the transfer direction. The guide rail 420a includes two transfer arms 420b1 and 420b2 for transferring the wafers W. The arms 420b1 and 420b2 are supported on the guide rail 420a so that they may slide thereon by magnetic force. The transfer arms 420b1 and 420b2 include articulated transfer arm bodies 420b11 and 420b21, and forks 420b12 and 420b22, respectively. The transfer arm bodies 420b11 and 420b21 may extend, contract, and swing. The forks 420b12 and 420b22 are attached to the heads of the transfer arm bodies 420b11 and 420b21. The forks 420b12 and 420b22 may support the wafers W thereon.

The transfer stage 420 has one end provided with a positioning mechanism 420c for positioning the wafer W. The positioning mechanism 420c may position the wafer W by rotating a turntable 420c1 with the wafer W mounted thereon, and detecting the condition of the edge of the wafer by an optical sensor 420c2.

The two load lock chambers 405a and 405b contain wafer tables 405a1 and 405b1 to support the wafers W thereon, respectively. The load lock chambers 405a and 405b also include at both ends thereof gate valves 405a2 and 405a3 and 405b2 and 405b3 that may close airtight, respectively. The transfer system may thus transfer the wafer W between the cassettes 410b1 to 410b3, the load lock chambers 405a and 405b, and the positioning mechanism 420c.

The processing system S includes a transfer chamber 430 and four process modules PM 1 to PM 4 (each PM corresponds to a substrate processing apparatus). The transfer chamber 430 is connected to the PM 1 to PM 4 via gate valves 440a to 440d, respectively, that may close airtight. The transfer chamber 430 contains an arm 430a that may extend, contract, and swing.

The PM 1 to PM 4 contain susceptors 450a to 450d, respectively, to support the wafers thereon. The transfer chamber 430 and the PM 1 to PM 4 are each evacuated to a desired pressure. The processing system may operate as follows. The arm 430a may transfer the wafer W from the load lock chamber 405 through the transfer chamber 430 to each PM. The wafer is mounted on each susceptor 450 and is deposition-processed. The wafer is then transferred from each PM through the transfer chamber 430 back to the load lock chamber 405.

In this embodiment, the wafer W is transferred to the PM 1 or PM 3 for the Ti layer process, and is then transferred to the PM 2 or PM 4 for the TiN layer process. The PM 1 to PM 4 may perform, however, various processes in addition to the deposition process, such as a diffusion process, an etching process, an ashing process, and a sputtering process.

Each of the PM 1 to PM 4 may also perform the high-temperature (around 650 C) deposition process, the medium-temperature (around 550 C) deposition process, and the low-temperature (around 450 C) deposition process. The low-temperature deposition process includes, for example, the ALD and the low temperature Ti (LTTi). The medium-temperature deposition process includes, for example, the deposition process for shallow junction (SJ). The high-temperature deposition process includes, for example, the existing known deposition processes.

(Internal Configuration of Each PM)

Figure 4:
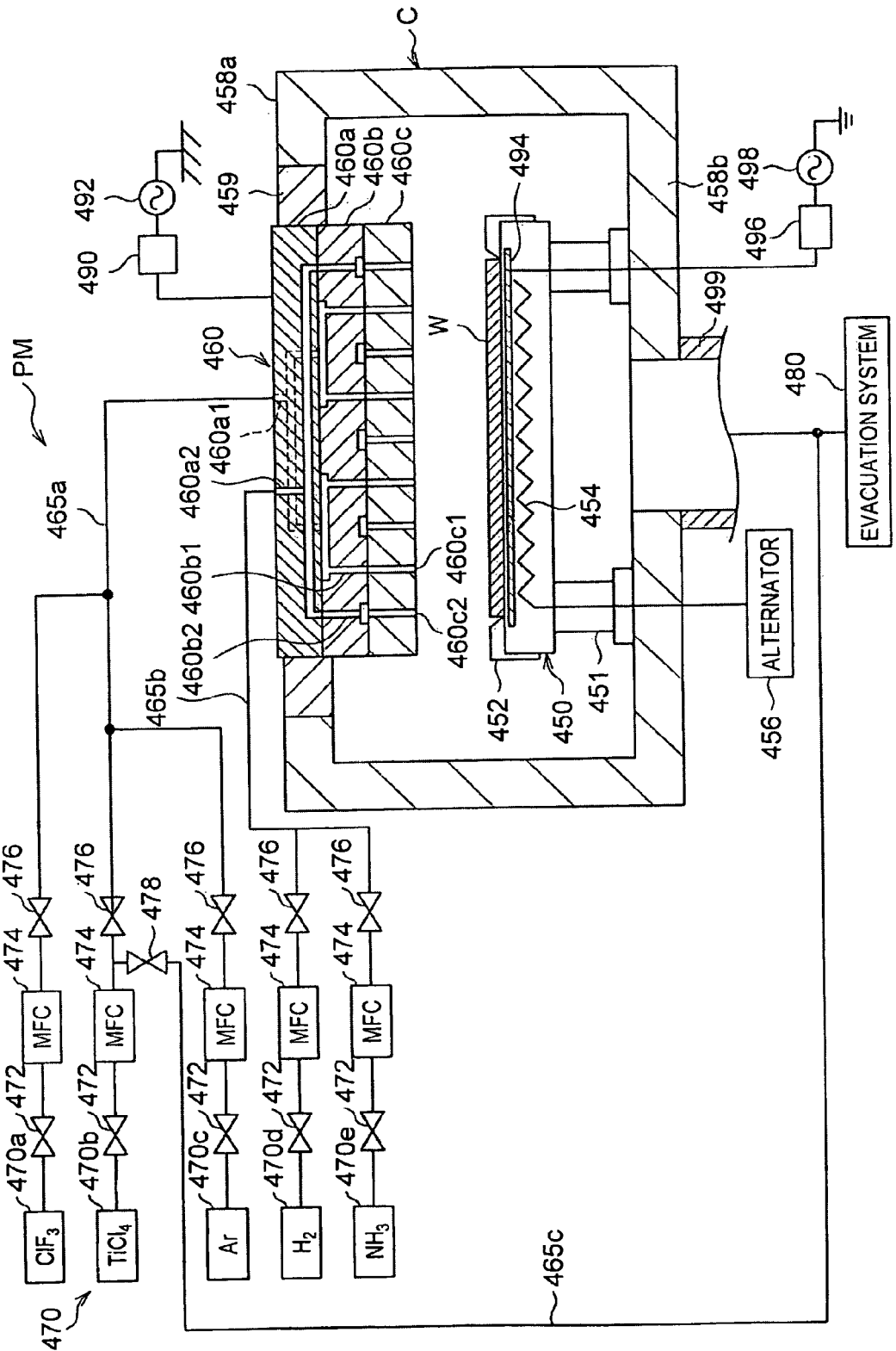
FIG. 4 is a vertical cross sectional view of each PM according to each embodiment.

The internal configuration of each PM is described below, with reference to the vertical cross sectional view in FIG. 4. The PM includes an airtight approximately cylindrical chamber C. The chamber C contains the susceptor 450 to support the wafer W thereon. The susceptor 450 is made of, for example, ceramic such as AlN. The susceptor 450 is supported by a cylindrical support member 451.

The susceptor 450 is provided with a guide ring 452 at its outer edge that guides the wafer W and focuses the plasma. The susceptor 450 also includes a stage heater 454 embedded therein. Connected to the stage heater 454 is an alternating-current power supply 456 outside the chamber C. The power supply 456 outputs an alternating-current voltage that may maintain the stage heater 454 at a stage heater set temperature defined by the process recipe. The wafer W may thus be maintained at a predetermined temperature.

The chamber C has a top wall 458a provided with a shower head 460 via an insulating member 459. The shower head 460 includes an upper block 460a, a middle block 460b, and a lower block 460c.

The upper block 460a includes a gas passage 460a1 and a gas passage 460a2 formed therethrough. The middle block 460b includes a gas passage 460b1 and a gas passage 460b2 formed therethrough. The gas passage 460b1 communicates with the gas passage 460a1. The gas passage 460b2 communicates with the gas passage 460a2. The lower block 460c includes a plurality of injection holes 460c1 and 460c2 that are alternately formed. The injection holes 460c1 and 460c2 communicate with the gas passages 460b1 and 460b2, respectively. Connected to the shower head 460 is a gas supply mechanism 470 via gas lines 465a and 465b.

The gas supply mechanism 470 includes gas sources 470a to 470e, a plurality of valves 472, a plurality of mass flow controllers 474, a plurality of valves 476, and a valve 478. The open and close of the valves 472 and 476 and the valve 478 may be controlled to selectively supply process gases from the gas sources into the chamber C. The mass flow controllers 474 may control flow rates of the process gases passing through them respectively to adjust the process gas to have a desired concentration.

The gas sources include a $ClF_3$ gas source 470a, a $TiCl_4$ gas source 470b, an Ar source 470c, an $H_2$ source 470d, and an $NH_3$ gas source 470e. The $ClF_3$ gas source 470a supplies a $ClF_3$ gas as a cleaning gas. The $TiCl_4$ gas source 470b supplies a $TiCl_4$ gas containing a Ti for forming a Ti layer. The Ar source 470c supplies an Ar gas as a plasma excitation gas. The $H_2$ source 470d supplies a $H_2$ gas as a reduction gas. The $NH_3$ gas source 470e supplies a $NH_3$ gas containing a N for nitriding the Ti layer.

Connected to the $ClF_3$ gas source 470a, the $TiCl_4$ gas source 470b, and the Ar source 470c is the gas line 465a. Connected to the $H_2$ source 470d and the $NH_3$ gas source 470e is the gas line 465b. Also connected to the $TiCl_4$ gas source 470b via a gas line 465c is an evacuation system 480.

Connected to the shower head 460 via a matching box 490 is a high frequency power supply 492. The susceptor 450 includes an electrode 494 embedded therein as an electrode opposed to the shower head 460. Connected to the electrode 494 via a matching box 496 is a high frequency power supply 498. The high frequency power supply 498 supplies the electrode 494 with high frequency power, thus impressing the bias voltage.

The chamber C has a bottom wall 458b provided with an evacuation pipe 499. Connected to the evacuation pipe 499 is the evacuation system 480 including a vacuum pump. The evacuation system 480 evacuates, via the evacuation pipe 499, gases in the chamber C, thus decompressing the chamber C to a predetermined degree of vacuum.

The high frequency power supply 492 supplies high frequency power to the shower head 460. The gas supply mechanism 470 supplies, via the shower head 460, the chamber C with the process gases. The high frequency power makes the process gases to excite and a plasma generates. The plasma causes the deposition process on the wafer W. When, for example, the Ti layer is formed in the PM 1, the processing system operates as follows. The wafer W is transferred to the PM 1. The $TiCl_4$ gas source 470b supplies the $TiCl_4$ gas. The $TiCl_4$ gas is carried by the Ar gas through the gas line 465a and the gas passages 460a1 and 460b1. The $TiCl_4$ gas is then injected from the injection hole 460c1 into the chamber C. The $H_2$ source 470d supplies the $H_2$ gas. The $H_2$ gas flows through the gas line 465b and the gas passages 460a2 and 460b2. The $H_2$ gas is then introduced from the injection hole 460c2 into the chamber C. The $TiCl_4$ gas and the $H_2$ gas are thus absolutely independently supplied into the chamber C. The gases are then mixed and excited by the high frequency power, and a plasma generates. The plasma may form the Ti layer ($TiSi_2$ layer) on the wafer W.

After the Ti layer is thus formed, the wafer W is further transferred as necessary to the PM 2, where the surface of the wafer W is nitrided. The nitriding process uses the process gases as follows. The Ar gas flows through the gas line 465*a* and the gas passages 460*a*1 and 460*b*1 and is introduced from a plurality of injection holes 460*c*1 into the chamber C. The $NH_3$ gas and the $H_2$ gas flow through the gas line 465*b* and the gas passages 460*a*2 and 460*b*2 and are introduced from a plurality of injection holes 460*c*2 into the chamber C. The supplied gases are excited by the high frequency power and a plasma generates. The plasma may provide the nitriding process (TiN layer forming process) to the wafer. After a predetermined number of wafers W are deposition-processed, the $ClF_3$ gas is supplied into the chamber C to clean the inside thereof.

(Function Configuration of EC)

Figure 5:
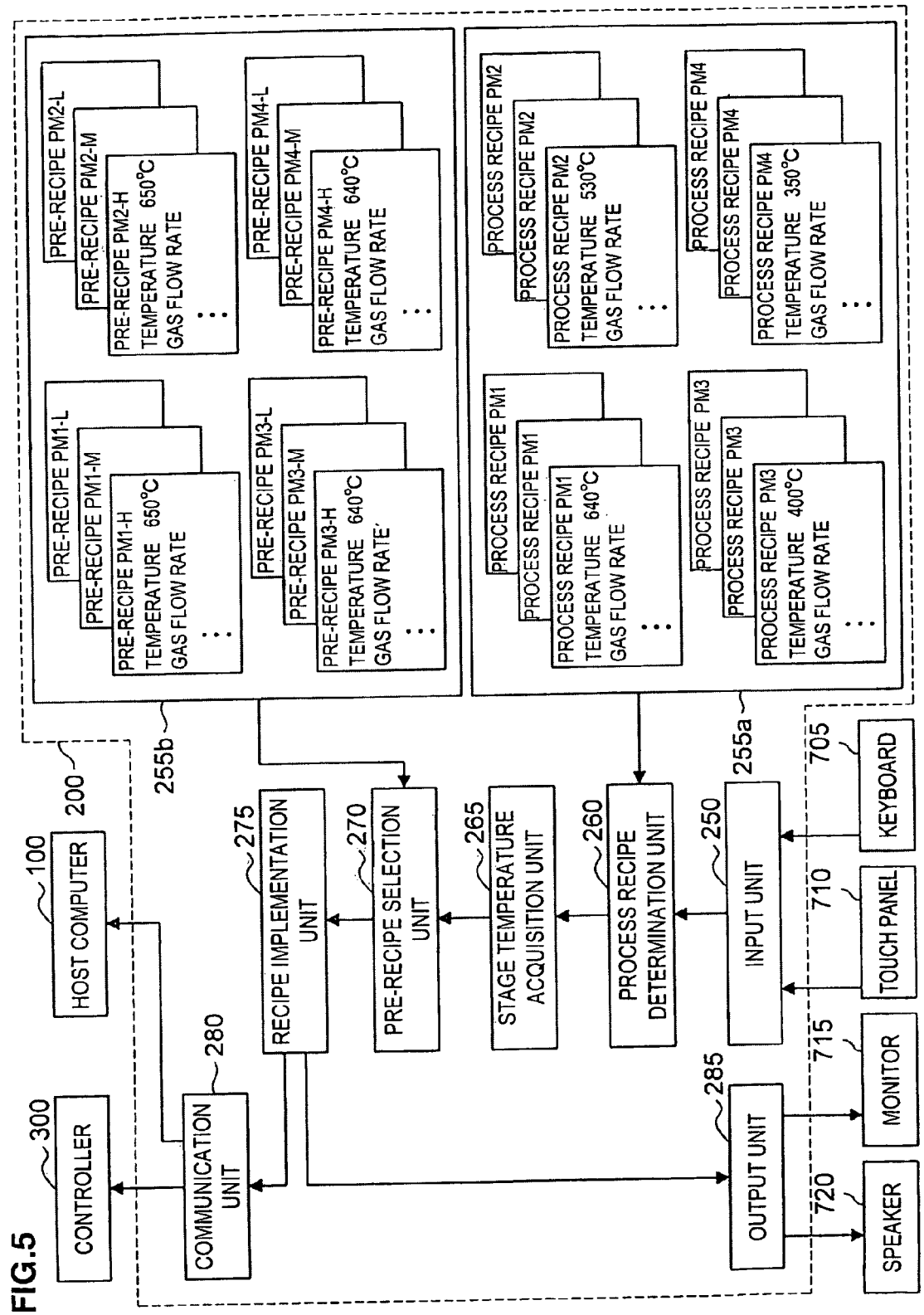
FIG. 5 is a function configuration diagram of EC according to a first embodiment.

With reference to FIG. 5, the functions of the EC 200 are described below. FIG. 5 is a block diagram of the functions. The EC 200 has functions represented by a plurality of blocks. The blocks include an input unit 250, a first storage unit 255*a*, a second storage unit 255*b*, a process recipe determination unit 260, a stage temperature acquisition unit 265, a pre-recipe selection unit 270, a recipe implementation unit 275, a communication unit 280, and an output unit 285.

When before a lot start button is pressed, the operator uses, for example, the keyboard 705 or the touch panel 710 to input a system recipe, the input unit 250 inputs it. The system recipe is a combination of one or more lot IDs (lot Nos), a transfer procedure of the wafer W to the PMs, and the names of the process recipes performed in respective PMs to which the wafer is transferred.

The input unit 250 inputs information to identify the object to be deposition-processed. The information is not limited to the lot IDs. The information may also be, for example, a wafer ID (wafer number) determined in advance for each wafer W. Specifically, the object to be deposition-processed may be identified by assignment with at least one of the lot ID (identification information) and the wafer W identification information. Similarly, the information to identify the process recipes is not limited to the process recipe name. The information may also be, for example, a process recipe number registered in advance for each process recipe. The system recipe may be created in advance and a system recipe name may be specified at the start of the lot.

The first storage unit 255*a* stores one or more of the process recipes PM 1 to PM 4 performed in the PM 1 to PM 4, respectively. The process recipe is a portion of the system recipe. The process recipe is a table including time-series data of the processing procedure of the wafer W. FIG. 6 illustrates a portion of the content of the process recipe PM 1. The process recipe PM 1 includes, for example, a processing procedure where the set temperature of the stage heater 454 in FIG. 4 is fixed to 640 C and the Ti layer is formed.

As shown by the step items and the time, the process recipe PM 1 first defines the processing procedure of the wafer W as steps in a time series, such as STEP 1 for 10 seconds, STEP 2 for five seconds, and STEP 3 for five seconds. The process recipe PM 1 shows detailed data in each step of the processing procedure of the wafer W as follows. For the initial 10 seconds (STEP 1), the atmosphere in the PM 1 is controlled to have a pressure of two Torr and an $H_2$ gas flow rate of 20 sccm. For the next five seconds (STEP 2), the atmosphere has a pressure of five Torr, a $TiCl_4$ gas flow rate of 20 sccm, and a $H_2$ gas flow rate of 20 sccm. For the next five seconds (STEP 3), the atmosphere has a pressure of zero Torr and an Ar gas flow rate of 1000 sccm. The wafer W transferred to the PM 1 is processed according to the processing procedure of the process recipe PM 1.

Note that the first storage unit 255*a* holds link information (not shown) that links the process recipe names and the process recipe contents corresponding to the respective names. For example, the first storage unit 255*a* may store, as the link information, addresses at which the process recipes contents corresponding to the respective process recipe names are stored, the addresses being stored corresponding to the names.

The second storage unit 255*b* stores a plurality of types of pre-recipes corresponding to the process recipes so that the control procedure of the PM may be changed corresponding to specific data in each process recipe. Specifically, the second storage unit 255*b* stores three recipes corresponding to the process recipes: a recipe for the high-temperature process (a high-temperature pre-recipe), a recipe for the medium-temperature process (a medium-temperature pre-recipe), and a recipe for the low-temperature process (a low-temperature pre-recipe). For the process recipe PM 1, for example, the second storage unit 255*b* stores, corresponding to the stage heater set temperature (also referred to as temperature data) in the process recipe PM 1, a pre-recipe PM 1-H (the high-temperature pre-recipe), a pre-recipe PM 1-M (the medium-temperature pre-recipe), and a pre-recipe PM 1-L (the low-temperature pre-recipe). Similarly, for the process recipes PM 2 to PM 4, the second storage unit 255*b* stores three types of pre-recipes.

The pre-recipe is a table including data of the control procedure of the PM before processing the wafer W. The pre-recipe is used to optimally condition the inside of the PM before processing the wafer W. Note that the second storage unit 255*b* holds link information (not shown) that links the process recipe names and three types of pre-recipe contents corresponding to the respective names. Actually, the data stored in the first and second storage units 255*a* and 255*b* is saved in the ROM 205 or the RAM 210 in FIG. 2 or not-shown other memories.

The process recipe determination unit 260 (which corresponds to the determination unit) receives the lot ID and the recipe name from the input unit 250. The process recipe name is specified by the operator. A plurality of process recipes is stored in the first storage unit 255*a*. The unit 260 determines, according to the link information, the process recipe content corresponding to the recipe name from among the process recipes stored in the unit 255*a*. When, for example, the unit 260 receives a recipe name of "PM 1," it uses the link information to acquire the address at which the recipe (process recipe PM 1) corresponding to the "PM 1" is stored, thus determining the process recipe PM 1.

As described above, the process recipe is determined by the process recipe determination unit 260. The stage temperature acquisition unit 265 (which corresponds to the acquisition unit) acquires the stage heater set temperature (temperature data) as specific data from among data in the process recipe. The temperature data acquired from the process recipe is not limited to the stage heater set temperature. The temperature data may also be, for example, the shower heater temperature (i.e., the temperature of a heater on the shower head 460). The stage heater 454 is adapted to provide an in-plane temperature gradient. The stage heater set temperature may thus be the set temperature at the outer edge or the center of the stage heater 454. The specific data is not limited to the data on temperature. The data may also be, for example, pressure data, gas flow rate data, and plasma application power data.

As described above, the process recipe is determined by the process recipe determination unit 260, the three types of pre-recipes are stored in the second storage unit 255b, and the temperature data is acquired by the stage temperature acquisition unit 265. The pre-recipe selection unit 270 (which corresponds to the selection unit) selects, from among the three types of pre-recipes, one type of pre-recipe corresponding to the process recipe, particularly to the temperature data.

The recipe implementation unit 275 controls, according to the pre-recipe selected by the pre-recipe selection unit 270, the PM before processing the wafer. The unit 275 then controls, according to the process recipe determined by the process recipe determination unit 260, the deposition process on the wafer W transferred to the PM.

When the communication unit 280 receives from the recipe implementation unit 275 an instruction to control the deposition process, the unit 280 transmits to the controller 300 a control signal to control the PM. The PM is controlled according to the pre-recipe before processing the wafer. The PM then performs the deposition process on the wafer W according to the process recipe.

When, during the deposition process, an issue arises such as a recipe verify error (a recipe set in the parameter is not able to be performed), the output unit 285 displays a warning on the monitor 715 and outputs an alarm sound to the speaker 720.

Note that the functions of the EC 200 may actually be provided by the CPU 215. The CPU 215 may perform a program including a processing procedure for providing the functions. The functions of the EC 200 may actually be provided by a not-shown IC or the like. In this embodiment, for example, the functions of the process recipe determination unit 260, the stage temperature acquisition unit 265, the pre-recipe selection unit 270, and the recipe implementation unit 275 may be provided by the CPU 215 that may perform a program including a processing procedure for providing those functions.

(Operation of EC)

Figure 7:
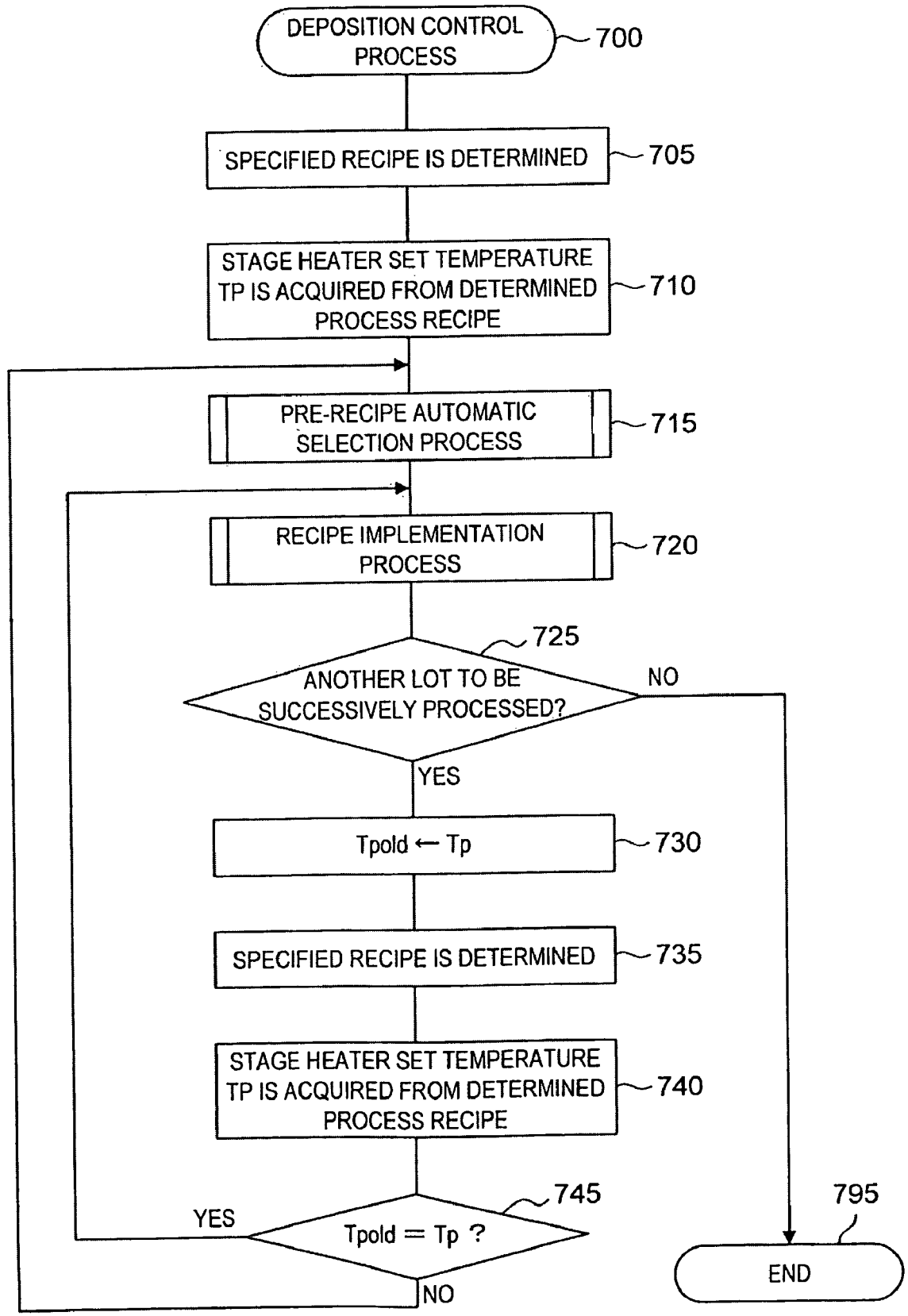
FIG. 7 is a flowchart of a deposition process routine performed in each embodiment.
Figure 8:
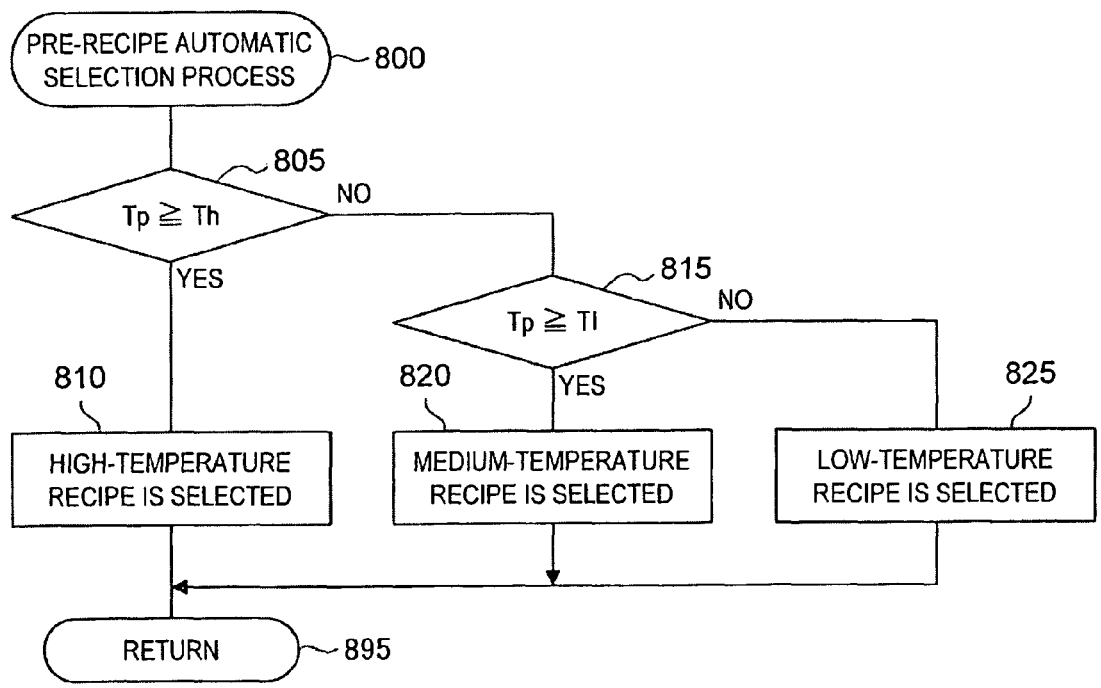
FIG. 8 is a flowchart of a pre-recipe automatic selection process routine performed in each embodiment.
Figure 9:
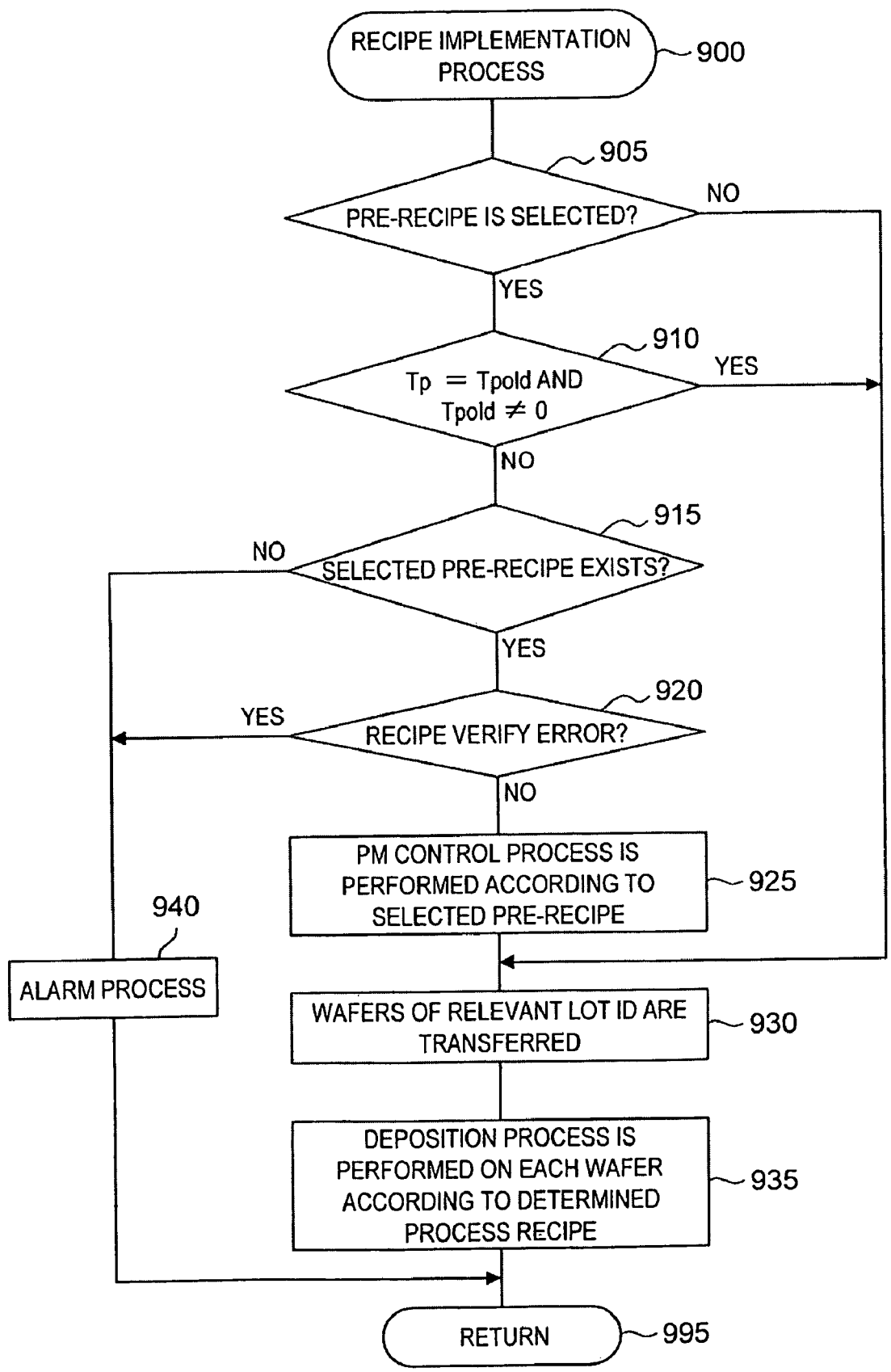
FIG. 9 is a flowchart of a recipe implementation process routine performed in a first embodiment.

With reference to FIGS. 7 to 9, the operation of the EC is described below. FIG. 7 is a flowchart of a deposition control process (main routine) performed by the EC 200. FIG. 8 is a flowchart of a pre-recipe automatic selection process (sub routine) called by the main routine in FIG. 7. FIG. 9 is a flowchart of a recipe implementation process (sub routine) called by the main routine in FIG. 7.

Before the deposition control process is started, the necessary system parameters are set in advance. The parameters include a low/medium temperature switching temperature Tl and a medium/high temperature switching temperature Th. The temperature Tl is used to determine whether the low- or medium-temperature pre-recipe is selected from the three types of pre-recipes stored in the second storage unit 255b. The temperature Th is used to determine whether the medium- or high-temperature pre-recipe is selected. In this embodiment, the three types of temperatures are defined as follows. The "high temperature" refers to a temperature equal to or more than the temperature Th. The "medium temperature" refers to a temperature lower than the temperature Th and equal to or more than the temperature Tl. The "low temperature" refers to a temperature lower than the temperature Tl.

This embodiment defines that the temperature Tl is 500 C and the temperature Th is 600 C. The temperatures Tl and Th may however be any value satisfying 450 C=<Tl<550 C and 550 C=<Th=<650 C.

Before the deposition control process is started, the set value of the pre-recipe automatic selection function is set to "enable" or "disable." The value is set before the user starts to use the substrate processing system 10 (usually, before the substrate processing system 10 is shipped). The user may, however, set the value again after the user starts to use the substrate processing system 10. This embodiment assumes that the set value of the pre-recipe automatic selection function is "enable." The operation of the EC 200 is described below with respect to the "enable" state. When, however, the set value of the pre-recipe automatic selection function is "disable," the optimum pre-recipe is not selected from the three types of pre-recipes and the PM is controlled according to the existing pre-recipe in a usual way.

Tp is the stage heater set temperature. Tpold is a variable to save Tp used in the immediately precedingly processed lot. Tpold is set to "0" as the initial setting.

Before the deposition control process is started, the operator specifies the lot ID to be deposition-processed and the recipe name. When a plurality of lots are to be successively processed, a plurality of lot IDs and a plurality of recipe names corresponding to the respective lot IDs are specified.

(Deposition Control Process)

The operator specifies the lot ID to be deposition-processed and the recipe name (when a plurality of lots are to be successively processed, the operator specifies a plurality of lot IDs and a plurality of recipe names applied to the respective lot IDs). The operator then turns on the lot start button, thus allowing the deposition control process to start with step 700 in FIG. 7. Control then proceeds to step 705 where the process recipe determination unit 260 uses the link information stored in the first storage unit 255a to determine, from the process recipes stored in the first storage unit 255a, a process recipe corresponding to the recipe name specified by the operator (i.e., the recipe name inputted from the input unit 250).

Control then proceeds to step 710 where the stage temperature acquisition unit 265 acquires, from the data in the determined process recipe, the stage heater set temperature Tp. Control then proceeds to step 715 where the pre-recipe selection unit 270 performs a pre-recipe automatic selection process.

(Pre-Recipe Automatic Selection Process)

The pre-recipe automatic selection process starts with step 800 in FIG. 8. Control proceeds to step 805 where the pre-recipe selection unit 270 determines whether the stage heater set temperature Tp is equal to or more than the medium/high temperature switching temperature Th. When the high-temperature deposition process is to be performed, the pre-recipe selection unit 270 determines "YES" at step 805. Control then proceeds to step 810 where the pre-recipe selection unit 270 uses the link information stored in the second storage unit 255b to select, from the three types of pre-recipes stored in the second storage unit 255b, the high-temperature pre-recipe corresponding to the determined process recipe. Control then proceeds to step 895 where the process is ended.

When the medium-temperature deposition process is to be performed, the pre-recipe selection unit 270 determines "NO" at step 805. Control then proceeds to step 815 where the unit 270 determines whether the stage heater set temperature Tp is equal to or more than the low/medium temperature switching temperature Tl. When the medium-temperature deposition process is to be performed, the pre-recipe selection unit 270 determines "YES" at step 815. Control then proceeds to step 820 where the unit 270 selects, from the three types of pre-recipes stored in the second storage unit 255b, the medium-temperature pre-recipe corresponding to the determined process recipe. Control then proceeds to step 895 where the process is ended.

When the low-temperature deposition process is to be performed, the pre-recipe selection unit 270 determines "NO" at step 815. Control then proceeds to step 825 where the unit 270 selects, from the three types of pre-recipes stored in the second storage unit 255b, the low-temperature pre-recipe corresponding to the determined process recipe. Control then proceeds to step 895 where the process is ended.

After the pre-recipe automatic selection process is performed, control returns to step 720 in FIG. 7 where a recipe implementation process (the deposition process on the wafer W) is controlled.

(Recipe Implementation Process)

Specifically, the recipe implementation process starts with step 900 in FIG. 9. Control proceeds to step 905 where the recipe implementation unit 275 determines whether the pre-recipe is selected. If the unit 275 determines that the pre-recipe is selected, then control proceeds to step 910. In step 910, the recipe implementation unit 275 determines whether the stage heater set temperature Tp is equal to the stage heater set temperature Tpold applied in the immediately preceding deposition process and the stage heater set temperature Tpold is not "0."

At this point, the stage heater set temperature Tpold is set to "0." The recipe implementation unit 275 then determines "NO" at step 910. Control then proceeds to step 915 where the unit 275 determines whether the selected pre-recipe exists (i.e., whether the pre-recipe is stored in the second storage unit 255b).

If the selected pre-recipe exists, then control proceeds to step 920 where the recipe implementation unit 275 checks for the recipe verify error. If the unit 275 determines no recipe verify error, then control proceeds to step 925 where the recipe implementation unit 275 controls the PM according to the procedure in the selected pre-recipe.

Control then proceeds to step 930 where the recipe implementation unit 275 controls the wafer transfer so that each of the wafers W of the relevant specified lot ID is transferred sequentially. Control then proceeds to step 935 where the recipe implementation unit 275 provides, according to the determined process recipe, the deposition process to each of the wafers W transferred to the PM. Control then proceeds to step 995 where the process is ended. In this way, the optimum pre-recipe is selected, thus providing the well-conditioned PM inside which a uniform and high-quality Ti layer (or TiN layer) is formed on the wafer W.

If, at step 905, the recipe implementation unit 275 determines that the pre-recipe is not selected, then the inside of the PM is not subject to a control according to the selected pre-recipe and control directly proceeds to step 930. In step 930, the relevant wafer W is transferred to the PM. Control then proceeds to step 935 where the deposition process is performed. Control then proceeds to step 995 where the process is ended. Also when the stage heater set temperature Tp equals the stage heater set temperature Tpold applied in the immediately preceding deposition process (and Tpold≠0), the inside of the PM is not subject to a control according to the selected pre-recipe and the processes at step 930 onward are performed, as described below.

If, at step 915, the recipe implementation unit 275 determines that the selected pre-recipe does not exist, or if, at step 920, the unit determines the recipe verify error, then control proceeds to step 940. In step 940, the output unit 285 displays a message representing an abnormality on the monitor 715 and outputs a warning sound to the speaker 720. Control then proceeds to step 995 where the process is ended.

If the deposition processes on 25 wafers W included in the lot ID specified by the operator are ended, then, control proceeds to step 725 in FIG. 7. In step 725, the process recipe determination unit 260 determines whether another lot to be successively processed is specified. If the operator has specified a single lot ID, then the process recipe determination unit 260 determines "NO" at step 725. Control then proceeds to step 795 where the process is ended.

(Successive Processings of Lots)

If the operator has specified a plurality of lot IDs, then the process recipe determination unit 260 determines "YES" at step 725. Control then proceeds to step 730 where the unit 260 stores the stage heater set temperature Tp in the stage heater set temperature Tpold.

Control then proceeds to step 735 where the process recipe determination unit 260 determines, according to the specified recipe name, the process recipe to process the next lot ID that is to be successively processed. Control then proceeds to step 740 where the stage temperature acquisition unit 265 acquires from the determined process recipe a new stage heater set temperature Tp. Control then proceeds to step 745 where the stage temperature acquisition unit 265 determines whether the acquired stage heater set temperature Tp equals the stage heater set temperature Tpold applied in the immediately preceding deposition process.

If the stage heater set temperature equals the set temperature in the immediately preceding deposition process, then the stage temperature acquisition unit 265 determines "YES" at step 745. Control then returns to step 720 where the recipe implementation unit 275 controls the recipe implementation process (the deposition process on the wafer W) again.

(Recipe Implementation Process of Successive Lots for the Same Stage Heater Set Temperature)

Specifically, the recipe implementation process starts with step 900 in FIG. 9. At step 905, the recipe implementation unit 275 determines whether the pre-recipe is selected. If it is determined that the pre-recipe is selected, then control proceeds to step 910. In step 910, the recipe implementation unit 275 determines whether the stage heater set temperature Tp equals the stage heater set temperature Tpold applied in the immediately preceding deposition process and the stage heater set temperature Tpold is not "0."

At this point, the stage heater set temperature Tp equals the set temperature Tpold in the immediately preceding deposition process (and Tpold≠0). The recipe implementation unit 275 thus determines "YES" at step 910. Control then proceeds to step 930 where the recipe implementation unit 275 controls the wafer transfer so that each of the wafers W of the relevant specified lot ID is transferred sequentially without the control of the inside of the PM according to the pre-recipe. Control then proceeds to step 935 where the recipe implementation unit 275 performs, according to the process recipe, the deposition process to each of the wafers of another lot to be successively processed, as described above.

(Recipe Implementation Process of Successive Lots for a Different Stage Heater Set Temperature)

If the stage heater set temperature Tp differs from the set temperature Tpold in the immediately preceding deposition process, then the stage temperature acquisition unit 265 determines "NO" at step 745 in FIG. 7. Control then returns to step 715 where the pre-recipe selection unit 270 selects another pre-recipe. Control then proceeds to step 720 where the recipe implementation unit 275 controls the recipe implementation process (the deposition process on the wafer W) again.

At this point, the stage heater set temperature Tp differs from the set temperature Tpold in the immediately preceding deposition process. The recipe implementation unit 275 then determines "NO" at step 910 after step 905 in FIG. 9. Then at step 925 after steps 915 and 920, the recipe implementation unit 275 controls the inside of the PM according to the pre-recipe. Control then proceeds to step 930 where the recipe implementation unit 275 controls the wafer transfer so that each of the wafers W of the relevant specified lot ID is transferred sequentially. Control then proceeds to step 935 where the recipe implementation unit 275 performs, according to the process recipe, the deposition process to each of the wafers of another lot to be successively processed, as described above.

Therefore, even when the lots of different process temperatures (stage heater set temperatures) are successively performed, the inside of the PM may be optimally conditioned for another deposition process according to another selected pre-recipe before the deposition process (i.e., between the successively performed lots). For every lot to be successively performed, therefore, the wafer W may be deposition-processed optimally.

Previous experiments on the various product processes have shown that when the temperature data in the process recipe is largely different for different product processes, it may be required that data in the pre-recipe such as the gas flow rate and the RF output be set again to an optimum value that does not correspond to the degree of change in the temperature data in the process recipe. Specifically, a large change in the set temperature for different process types may provide a large change in the content of the pre-recipe itself such as the gas flow rate or the RF output.

If, however, different types of processes performed may require the operator to manually re-register the data of the pre-recipe to the optimum value, the registration will take a long time and be very inefficient, and a typing error during the registration may cause each PM of the substrate processing system 10 to be controlled according to the pre-recipe including the error. No optimum deposition process may be applied to the substrate and no optimum process result may thus be provided.

Cooperation of the PM itself (hardware) and the software to control the PM may construct a system that automatically controls the substrate processing system so that the system may flexibly correspond to a further hardware advance, thus effectively increase the commercial value of the expensive PM. This is very important.

In the substrate processing system 10 according to this embodiment, the process recipes are provided to the respective product processes, but the pre-recipes are not provided to the respective process recipes (i.e., the product processes). A plurality of types of pre-recipes may be provided, for example, to specific data (such as temperature data) of the process recipe so that one pre-recipe may be selected from high temperature, medium temperature, and low temperature pre-recipes.

A pre-recipe may be selected corresponding to the specific data of the process recipe. Therefore, in the substrate processing system 10 according to this embodiment, the inside of the PM may be optimally conditioned for each process before the wafer W is processed. A more uniform and higher quality layer may thus be formed on the wafer W in the PM.

Note that even when the low/medium temperature switching temperature Tl equals the medium/high temperature switching temperature Th, or the low/medium temperature switching temperature Tl is higher than the medium/high temperature switching temperature Th, the pre-recipe selection unit 270 may select the pre-recipe according to the order of the steps in FIG. 8.

The process recipe includes two methods to specify the stage heater set temperature. One method is, as shown in FIG. 6, to specify the temperature in a constant term in a recipe. The constant term sets the stage heater set temperature as a constant value in the recipe. The other method is to specify the temperature for each step of a recipe. When the stage heater set temperature is specified in the constant term, the stage temperature acquisition unit 265 acquires the stage heater set temperature shown in the constant term as the temperature data. When the stage heater set temperature is specified for each step of the recipe, the stage temperature acquisition unit 265 may acquire the stage heater set temperature shown at the first step of the process recipe as the temperature data. When, in addition, the stage heater set temperature is set to a variable parameter that may be changed at the lot start, the stage temperature acquisition unit 265 may acquire, as the temperature data, the set temperature of the variable parameter that is specified by the operator at the lot start.

If the alarm occurs at step 940 in FIG. 9, then the recipe implementation process is ended. It is then necessary to interrupt the processing of the lot in process and restart the deposition process on the wafer W of the same lot.

The process data during the deposition process (for example, the change over time in temperature, pressure, gas flow rate, or the like) is transmitted from the controllers 300a to 300n to the host computer 100 via the EC 200.

Second Embodiment

A substrate processing system 10 according to a second embodiment is described below. The substrate processing system 10 according to the second embodiment differs in function from the substrate processing system 10 according to the first embodiment in that it may correct predetermined data in the selected pre-recipe. Focusing on the difference, the substrate processing system 10 according to this embodiment is described below.

(Function Configuration of EC)

Figure 10:
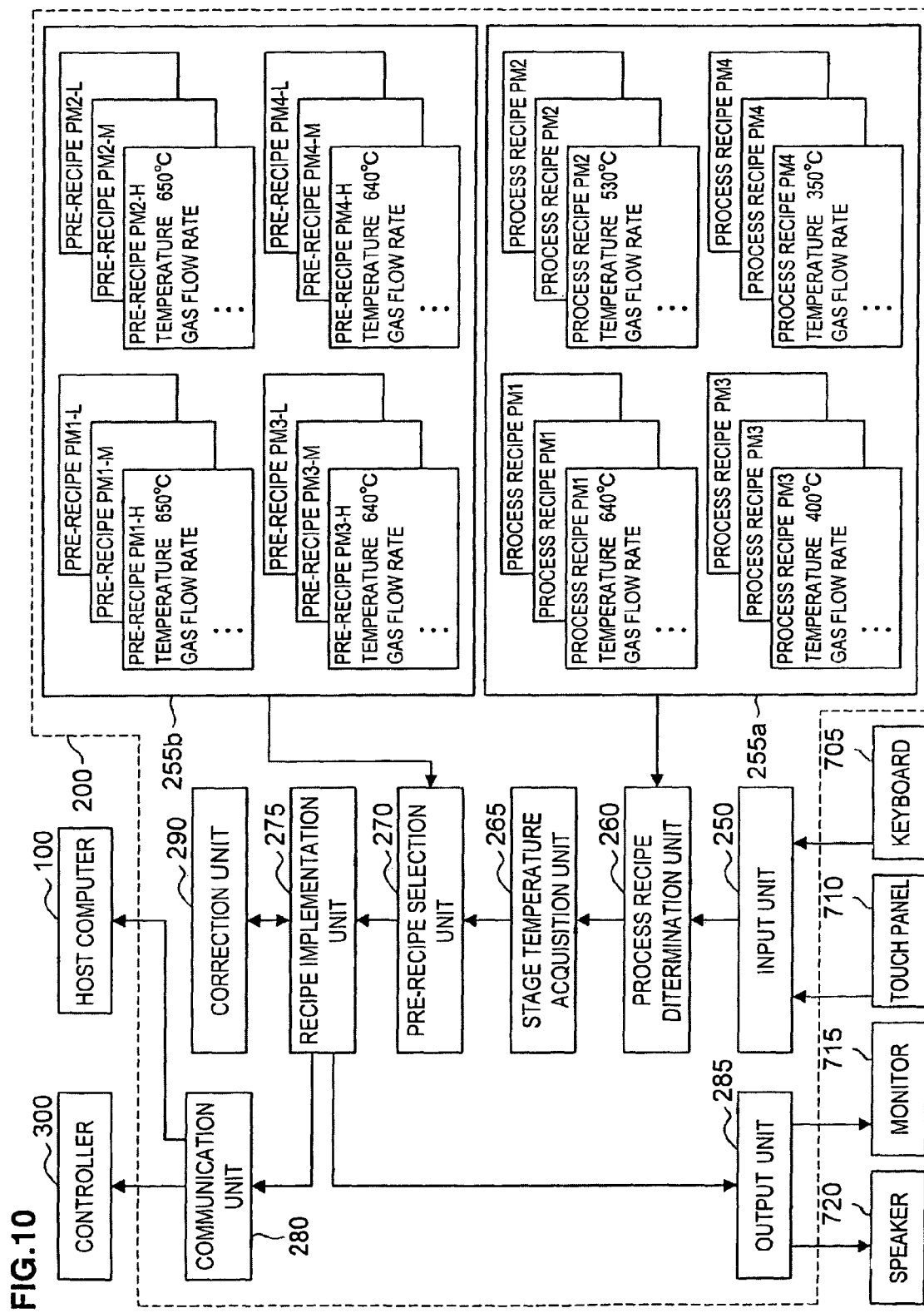
FIG. 10 is a function configuration diagram of EC according to a second embodiment.

Referring to FIG. 10, the functions of the EC 200 are described below. The EC 200 has, in addition to the functions shown by the blocks of the EC 200 in the first embodiment, a function shown by the block of the correction unit 290.

The correction unit 290 determines the degree of difference between data on temperature in the pre-recipe and temperature data acquired from the process recipe (stage heater set temperature). The unit 290 then uses the difference to correct the predetermined data in the pre-recipe. Note that the function of the correction unit 290 may be provided by the CPU 215 performing a program that includes a processing procedure for providing the function.

(Operation of EC)

Figure 11:
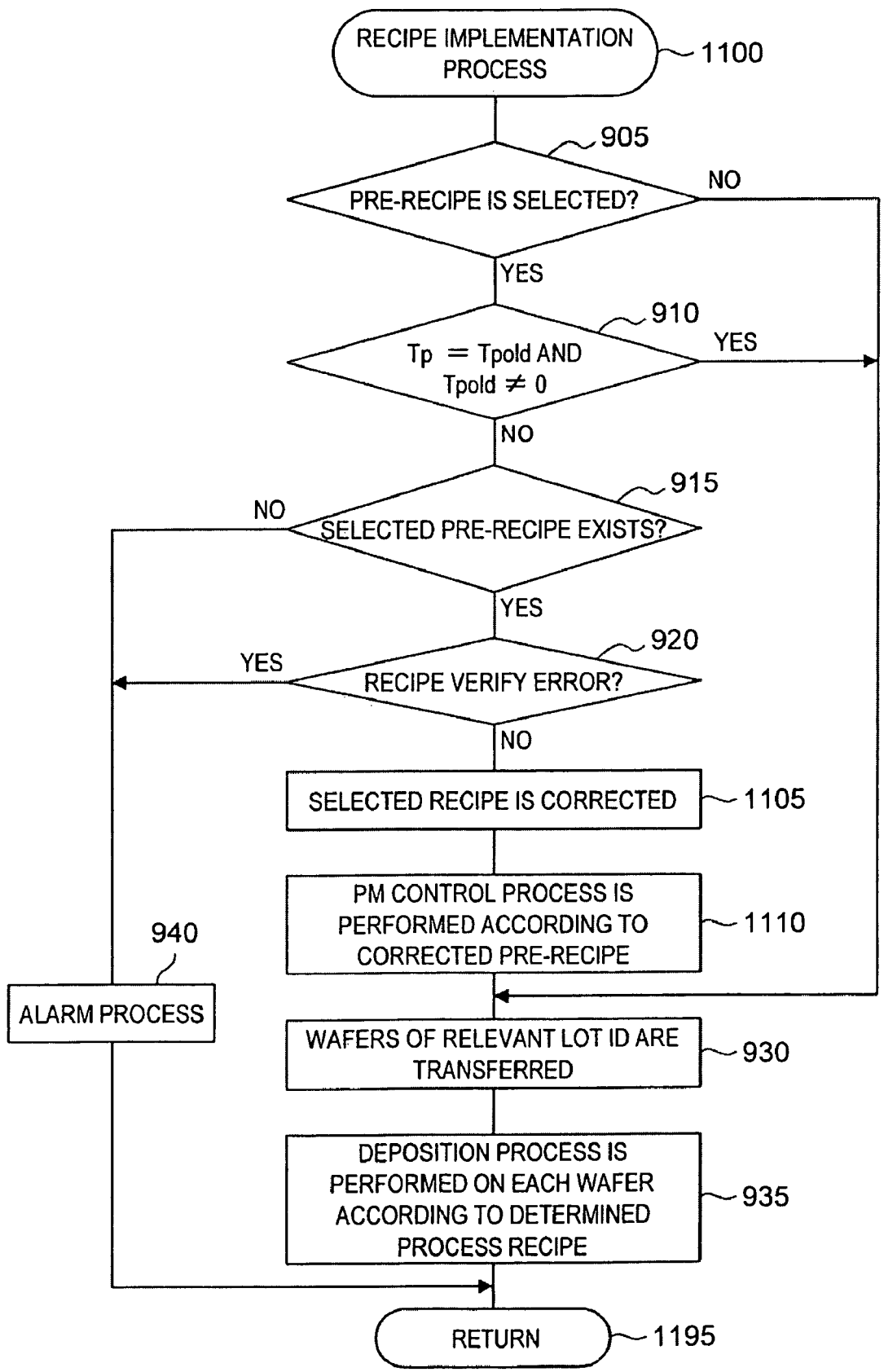
FIG. 11 is a flowchart of a recipe implementation process routine performed in a second embodiment.

Referring to FIG. 11, the operation of the EC is described below. FIG. 11 is a flowchart of a recipe implementation process called by the main routine in FIG. 7. Note that this embodiment starts, as in the first embodiment, the deposition control process at step 700 in FIG. 7, and performs the pre-recipe automatic selection process (see FIG. 8) at step 715 after steps 705 and 710, thus selecting the optimum pre-recipe corresponding to the temperature data acquired from the process recipe. Control then proceeds to step 720 where the recipe implementation process including a correction process as described below is performed. After steps 725 to 745 are performed, the processes of steps 715 to 745 are repeated as appropriate. Control then proceeds to step 795 where the deposition control process is ended.

(Recipe Implementation Process)

Referring to FIG. 11, a recipe implementation process according to this embodiment starts with step 1100. At steps 905 to 920, the recipe implementation unit 275 performs various error determination processes on the selected pre-recipe (steps 905, 915, and 920) and a determination process on the set temperature (step 910). If no predetermined error or the like exists, step 920 determines "NO." Control then proceeds to step 1105 where the correction unit 290 corrects the selected pre-recipe according to a predetermined rule.

Figure 12:
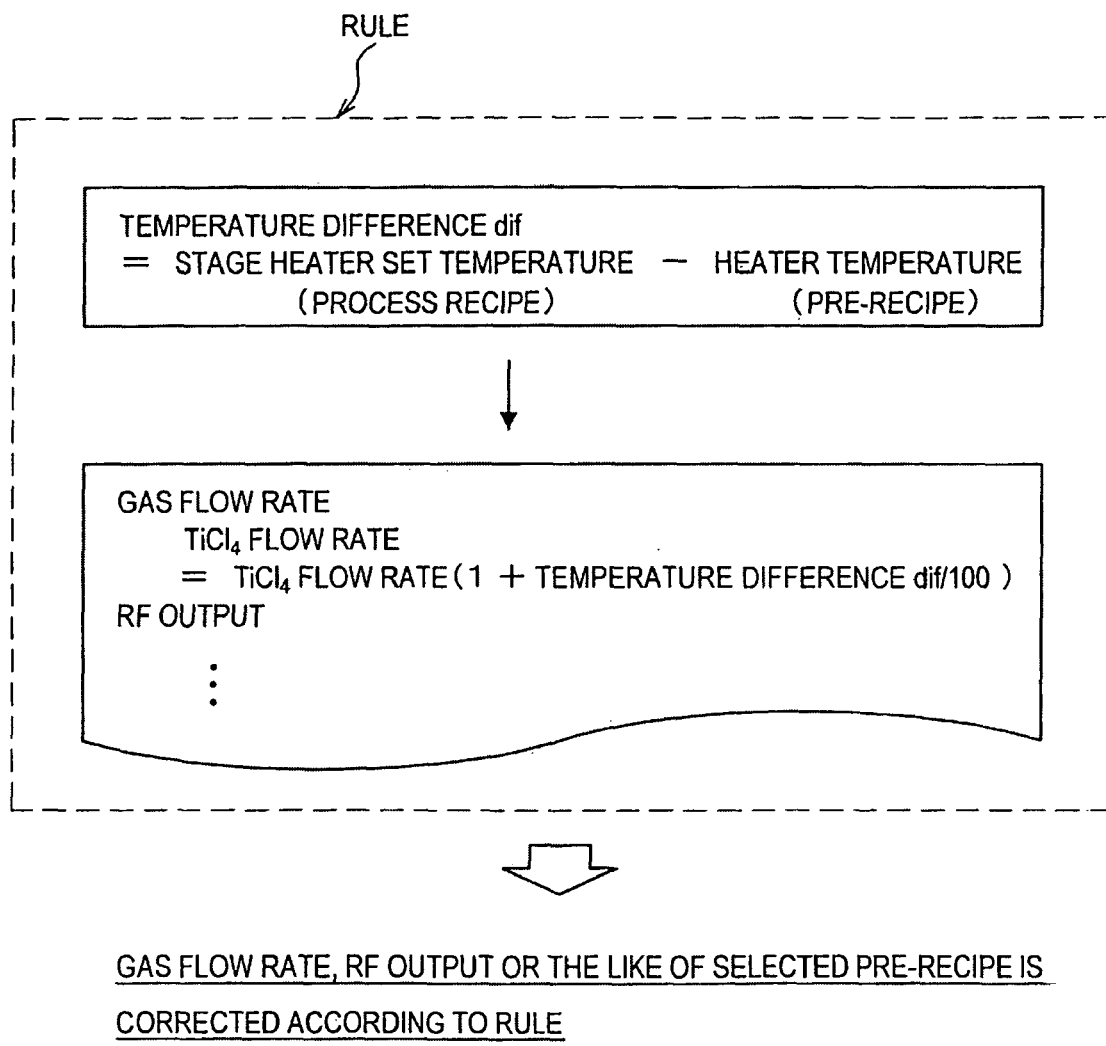
FIG. 12 illustrates a portion of a rule to correct a pre-recipe.

When, for example, a rule is specified in advance as shown in FIG. 12, the correction unit 290 first determines the difference between the stage heater set temperature defined in the process recipe and the heater temperature defined in the selected pre-recipe as a temperature difference dif. The correction unit 290 then corrects the predetermined data in the selected pre-recipe. Specifically, for example, the correction unit 290 corrects the $TiCl_4$ gas flow rate defined in the pre-recipe so that it changes by $TiCl_4$ gas flow rate×(1+temperature difference dif/100). The correction unit 290 also corrects other predetermined process conditions according to the rule.

Control then proceeds to step 1110 where the recipe implementation unit 275 controls the PM according to the procedure in the corrected pre-recipe. Then, at steps 930 and 935, the recipe implementation unit 275 applies the deposition process to each of the wafers W transferred to the PM to according to the procedure in the process recipe. Control then proceeds to step 1195 where the recipe implementation process is ended. The pre-recipe may thus be corrected to the optimum data for the process recipe to be successively performed, thus better conditioning the inside of the PM. A more uniform and higher quality Ti layer (or TiN layer) may thus be formed on the wafer W in the PM.

The degree of difference between the temperature data in the process recipe and the temperature data in the selected pre-recipe is not limited to the difference between the temperature data. The degree of difference may also be determined, for example, by a ratio of the temperature data in the process recipe and the temperature data in the pre-recipe.

Thus, the substrate processing system 10 according to this embodiment corrects predetermined data in the pre-recipe according to a predetermined rule. As in the first embodiment, a large variation in the stage heater set temperature for each product process may be addressed by selection of the optimum pre-recipe for the product process (process recipe) from the types of pre-recipes. A slight variation in the stage heater set temperature for the same type of process may be addressed, as shown in this embodiment, by correction of the selected pre-recipe. In this way, the pre-recipe data may be optimized at two stages of selection and correction, thus conditioning the inside of the PM more flexibly for each product process. Thus, in the PM that is extremely well-conditioned, a more uniform and higher quality deposition process may be applied to the wafer W.

In the above description, the functions of the process recipe determination unit 260, the stage temperature acquisition unit 265, the pre-recipe selection unit 270, the recipe implementation unit 275, and the correction unit 290 are provided by the CPU 215 in the EC 200 performing the steps in FIG. 7 to FIG. 9 and FIG. 11. When, however, the controllers 300 include a CPU, the steps in FIG. 7 to FIG. 9 and FIG. 11 may be shared and performed by at least one of the EC 200 and the controller 300. In the steps in FIG. 7, for example, the steps 705, 720, 725, and 745 may be performed by EC 200 and the steps 710, 715, and 730 to 740 may be performed by the controller 300.

The functions of the control device according to the present invention may thus be provided by at least one of the EC 200 and the controller 300. The distribution of the processing load to the EC 200 and the controller 300 may control the deposition process more smoothly.

In the above embodiments, the operations of the units are related to each other. The operations may thus be replaced with a series of operations in consideration of the relations. The operations of the units may also be replaced with the processes by the units, thus providing program embodiments. The program may be stored in a computer-readable storage medium, thus changing the program embodiment to a computer-readable storage medium embodiment recording the program.

Thus, the preferred embodiments of the present invention have been described with reference to the accompanying drawings, but it will be appreciated that the present invention is not limited to the disclosed embodiments. It is apparent that those skilled in the art will readily envision various changes or modifications without departing from the scope of the invention as defined in the appended claims, and all such changes or modifications are intended to be included within the scope of the present invention.

The substrate processing apparatus (included in the PM) according to the present invention may be any one of the microwave plasma processing apparatus, the inductively-coupled plasma processing apparatus, and the capacitively-coupled plasma processing apparatus.

The substrate processing apparatus according to the present invention may perform any substrate processes, in addition to the deposition process, such as the thermal diffusion process, the etching process, the ashing process, and the sputtering process.

The present invention may be applicable to a control device of the substrate processing apparatus that may flexibly control the substrate processing apparatus for various processes.

What is claimed is:

1. A control device of a substrate processing apparatus that controls the substrate processing apparatus according to a pre-recipe including data of a control procedure of the substrate processing apparatus, and processes a substrate to be processed which transferred to the substrate processing apparatus according to a process recipe including data of a processing procedure of the substrate to be processed, comprising:
  a first storage unit storing one or more process recipes;
  a second storage unit that stores a plurality of types of pre-recipes corresponding to the process recipes so that the control procedure of the substrate processing apparatus may be changed corresponding to specific data in each process recipe;
  an determination unit that determines, in response to a recipe specified for one or more substrates to be processed, a process recipe corresponding to the specified recipe from a plurality of process recipes stored in the first storage unit;
  an acquisition unit that acquires the specific data from data in the determined process recipe; and
  a selection unit that selects one pre-recipe corresponding to the acquired specific data from the plurality of the types of pre-recipes stored in the second storage unit corresponding to the determined process recipe,
  wherein the acquisition unit acquires, as the specific data, temperature data that is data on temperature included in the determined process recipe,
  wherein the second storage unit stores the plurality of types of pre-recipes corresponding to the process recipes, the pre-recipes showing different control procedures for different temperatures used to control the substrate processing apparatus, and
  wherein the selection unit compares the acquired temperature data and a given threshold, and selects, according to a result of the comparing, a pre-recipe corresponding to the acquired temperature data from the plurality of the types of pre-recipes stored in the second storage unit.

2. The control device of a substrate processing apparatus of claim 1, wherein the second storage unit stores, corresponding to the temperature data used to control the substrate processing apparatus, a high-temperature pre-recipe, a medium-temperature pre-recipe, and a low-temperature pre-recipe, the pre-recipes corresponding to the process recipes, the selection unit compares the acquired temperature data and a first threshold for distinguishing between a high temperature and a medium temperature, when the result of the comparing shows that the temperature data is equal to or more than the first threshold, the selection unit selects the high-temperature pre-recipe stored in the second storage unit, when the result of the comparing shows that the temperature data is less than the first threshold, the selection unit further compares the temperature data and a second threshold for distinguishing between a medium temperature and a low temperature, when the result of the comparing shows that the temperature data is equal to or more than the second threshold, the selection unit selects the medium-temperature pre-recipe stored in the second storage unit, and when the result of the comparing shows that the temperature data is less than the second threshold, the selection unit selects the low-temperature pre-recipe stored in the second storage unit.

3. The control device of a substrate processing apparatus of claim 1, wherein the one or more substrates to be processed is determined by specifying at least one of identification information on a lot including a plurality of substrates and identification information on a substrate.

4. The control device of a substrate processing apparatus of claim 1, wherein the determination unit determines, in response to specification of identification information on a first lot, specification of a first recipe to be used for the first lot, specification of identification information on a second lot, and specification of a second recipe to be used for the second lot, from the process recipes stored in the first storage unit, a first and a second process recipe corresponding to the specified first and second recipes, respectively, the acquisition unit acquires, from data in the determined first and second process recipes, first and second temperature data, and the selection unit selects respectively, when the first and second temperature data differ, each pre-recipe corresponding to the first process recipe and another pre-recipe corresponding to the second process recipe from types of pre-recipes stored in the second storage unit to control the substrate processing apparatus using the pre-recipes before the first and second lots are processed.

5. The control device of a substrate processing apparatus of claim 1, further comprising a correction unit that determines a degree of difference between the data on temperature in the pre-recipe selected by the selection unit and the temperature data acquired by the acquisition unit, and corrects, depending on the determined degree of difference, predetermined data in the selected pre-recipe.

6. A non-transitory computer readable storage medium having stored thereon a control program of a substrate processing apparatus, the control program allowing a computer to control the substrate processing apparatus according to a pre-recipe including data of a control procedure of the substrate processing apparatus, and to process a substrate to be processed which transferred to the substrate processing apparatus according to a process recipe including data of a processing procedure of the substrate, the control program comprising:

storing one or more process recipes in a first storage unit;

storing a plurality of types of pre-recipes corresponding to the process recipes in a second storage unit so that the control procedure of the substrate processing apparatus may be changed corresponding to specific data in each process recipe;

determining, in response to a recipe specified for one or more object substrates to be processed, a process recipe corresponding to the specified recipe from a plurality of process recipes stored in the first storage unit;

acquiring the specific data from data in the determined process recipe; and selecting, from the plurality of the types of pre-recipes stored in the second storage unit, one pre-recipe corresponding to the determined process recipe, particularly to the acquired specific data, wherein the acquiring further comprises acquiring, as the specific data, temperature data that is data on temperature included in the determined process recipe, wherein the storing a plurality of types of pre-recipes further comprises storing the plurality of types of pre-recipes corresponding to the process recipes, the pre-recipes showing different control procedures for different temperatures used to control the substrate processing apparatus, and wherein the selecting further comprises comparing the acquired temperature data and a given threshold, and selecting, according to a result of the comparing, a pre-recipe corresponding to the acquired temperature data from the plurality of the types of pre-recipes.

7. A control device of a substrate processing apparatus that controls the substrate processing apparatus according to a pre-recipe including data of a control procedure of the substrate processing apparatus, and processes a substrate to be processed which transferred to the substrate processing apparatus according to a process recipe including data of a processing procedure of the substrate to be processed, comprising:

a first storage unit storing one or more process recipes;

a second storage unit that stores a plurality of types of pre-recipes corresponding to the process recipes so that the control procedure of the substrate processing apparatus may be changed corresponding to specific data in each process recipe;

an determination unit that determines, in response to a recipe specified for one or more substrates to be processed, a process recipe corresponding to the specified recipe from a plurality of process recipes stored in the first storage unit;

an acquisition unit that acquires the specific data from data in the determined process recipe; and a selection unit that selects one pre-recipe corresponding to the acquired specific data from the plurality of the types of pre-recipes stored in the second storage unit corresponding to the determined process recipe, wherein
the second storage unit stores the plurality of types of pre-recipes corresponding to the process recipes, the pre-recipes showing different control procedures for different specific data used to control the substrate processing apparatus, and
the selection unit compares the acquired specific data and a given threshold, and selects, according to a result of the comparing, a pre-recipe corresponding to the acquired specific data from the plurality of the types of pre-recipes stored in the second storage unit.

8. The control device of the substrate processing apparatus of claim 7, wherein the specific data is any one of a temperature data, a pressure data, a gas flow data, or an applied power data for generating plasma.

* * * * *